United States Patent [19]

Day

[11] Patent Number: 4,571,547

[45] Date of Patent: Feb. 18, 1986

[54] ADAPTIVE SIGNAL DETECTION SYSTEM ESPECIALLY FOR PHYSIOLOGICAL SIGNALS SUCH AS THE R WAVES OF ECG SIGNALS, WHICH IS DESENSITIZED TO ARTIFACTS

[75] Inventor: Christopher C. Day, Newtonville, Mass.

[73] Assignee: Clinical Data Inc., Boston, Mass.

[21] Appl. No.: 508,354

[22] Filed: Jun. 27, 1983

[51] Int. Cl.[4] .............................................. H03K 5/153
[52] U.S. Cl. .................................... 328/116; 307/359;
 307/360; 307/234; 328/150
[58] Field of Search ............... 307/359, 360, 362, 354,
 307/350, 234; 328/115–117, 150, 151; 128/708

[56] References Cited

U.S. PATENT DOCUMENTS 3,737,790  6/1973  Brown ................................. 307/359
4,056,738  11/1977  Gustafson .......................... 307/359

*Primary Examiner*—John Zazworsky
*Attorney, Agent, or Firm*—M. Lukacher

[57] ABSTRACT

Signals subject to amplitude variations, such as physiological signals, are detected when the amplitude thereof exceeds a threshold level, where the threshold level is made adaptive to both the amplitude and the rate of the signals so as to desensitize the detection process for artifacts, which occur sporadically, and to avoid the need for automatic gain control of the signals prior to detection.

19 Claims, 4 Drawing Figures

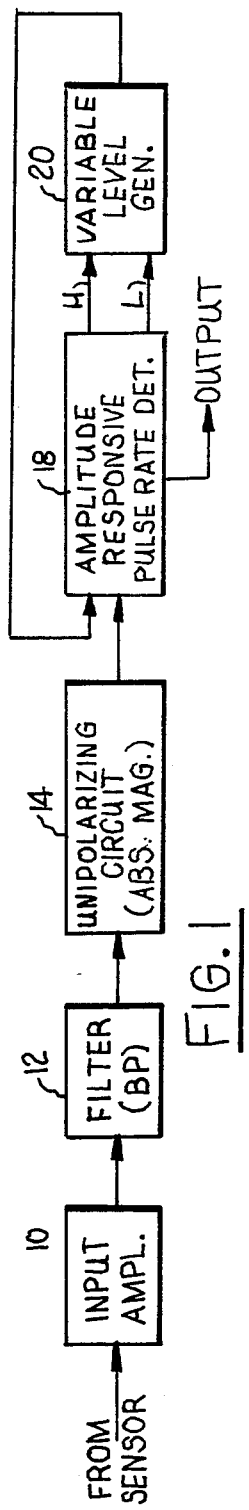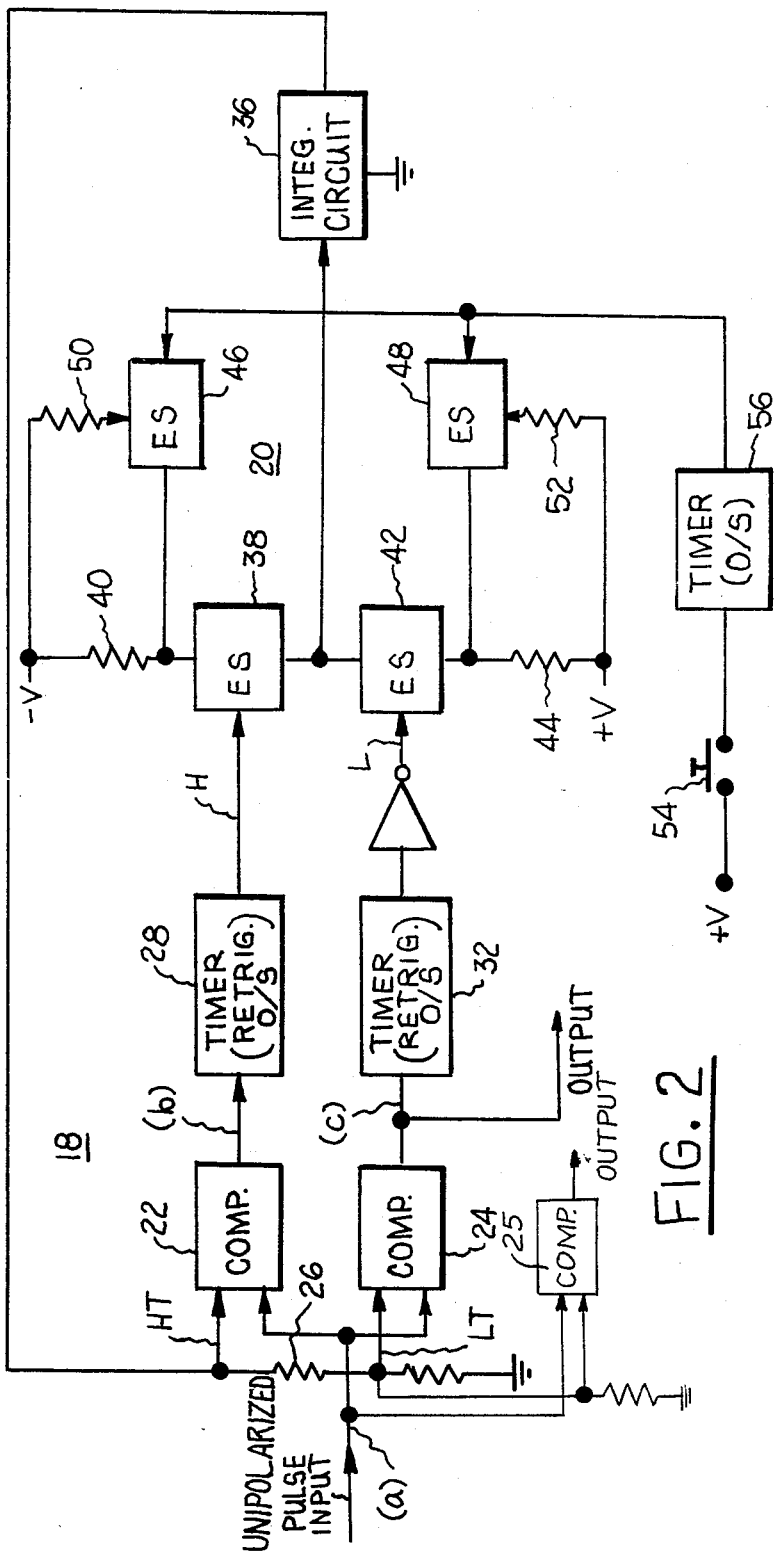
FIG. 1
FIG. 2

ADAPTIVE SIGNAL DETECTION SYSTEM ESPECIALLY FOR PHYSIOLOGICAL SIGNALS SUCH AS THE R WAVES OF ECG SIGNALS, WHICH IS DESENSITIZED TO ARTIFACTS

DESCRIPTION

The present invention relates to apparatus for detecting signals subject to amplitude variations, and particularly, for detecting pulsatile signals, such as physiological signals, and especially the R waves of electrocardiogram (ECG) signals.

It had been difficult to detect pulsatile signals which are subject to amplitude variations and which are accompanied by noise, such as of the type produced in response to physiological effects. They are usually derived by sensors such as electrodes. The noise may be artifacts, due to patient motion or other spurious physiological conditions. Physiological signals which may be detected in accordance with the invention can be the R wave components of ECG signals. The invention may also be used in the detection of signals representing respiration as may be derived from sensors connected to the chest or in the vicinity of a patient, especially an infant, to detect episodes of apnea.

The use of gain control and theshold detection for R waves has been suggested. Reference may be had to U.S. Pat. No. 3,779,237 issued Dec. 18, 1973 (See especially column 9 thereof) for a description of a threshold R wave detector, which follows conventional technology. The low duty cycle of the signals and the presence of noise components or artifacts makes the reliable detection of R waves difficult. Because of the low duty cycle, the average value or peak value of the signal which is used for gain control or threshold setting purposes is subject to relatively large variations in the presence of small amounts of artifacts and noise. Artifacts and noise distort the gain or threshold control signals. In some cases, the time constant of the gain or threshold control circuitry is made very long. This has the disadvantage of requiring a long settling time for initialization and also for the reestablishment of proper operation after the circuit is upset by an artifact or noise. Moreover, in the event of a cardiac arrest, the gain or threshold tends to decrease to a point where an artifact or a noise pulse is mistakenly taken as an R wave; causing the system with which the detector is used to fail to alarm in response to cardiac arrest.

Accordingly, it is a principal object of the present invention to provide improved apparatus especially suitable for detection of signals such as the R waves of ECG signals, which is desensitized to artifacts and noise.

It is a still further object of the present invention to provide improved apparatus for signal detection purposes which operates by establishing a variable threshold level and avoids the need for automatic gain control prior to detection.

It is a still further object of the present invention to provide improved apparatus for the detection of pulsatile signals having low duty cycle which is adaptive to changes in signal amplitudes while being resistant to noise and other artifacts.

It is a still further object of the present invention to provide an improved adaptive detection system for signals, such as R waves of ECG signals, which is reliable in the presence of cardiac arrest.

It is a still further object of the present invention to provide improved apparatus for the detection of signals such as the R waves of ECG signals, by establishing an adaptive threshold for the detection of such signals which can be initialized or reestablished rapidly, either automatically or selectively on command.

Briefly described, apparatus according to the invention is operative for the detection of repetitive signals subject to amplitude variations, such as pulsatile signals derived from physiological signal sensors (the R waves of an ECG signal, for example). The apparatus makes use of means for detecting such signals when they exceed a threshold value. Means are also provided for adaptively controlling the threshold level simultaneously in accordance with the repetition rate and the amplitude of the signals. The threshold level may be maintained by an integrator circuit which produces a ramp waveform as the theshold level. The ramp changes in amplitude at rate slow with respect to the changes in amplitude of the repetitive signals to be detected.

The foregoing and other objects, features and advantages of the invention, as well as presently preferred embodiments thereof, will become more apparent from a reading of the following description in connection with the accompanying drawings in which:

FIG. 1 is a diagram illustrating, in a general manner, apparatus for detection of repetitive signals, such as the R waves of the ECG signals, which embodies the invention;

FIG. 2 is a more detailed block diagram of the amplitude responsive pulse rate detector and variable level generator circuits of the system illustrated in FIG. 1 of a design in accordance with one embodiment of invention;

Figure 3:
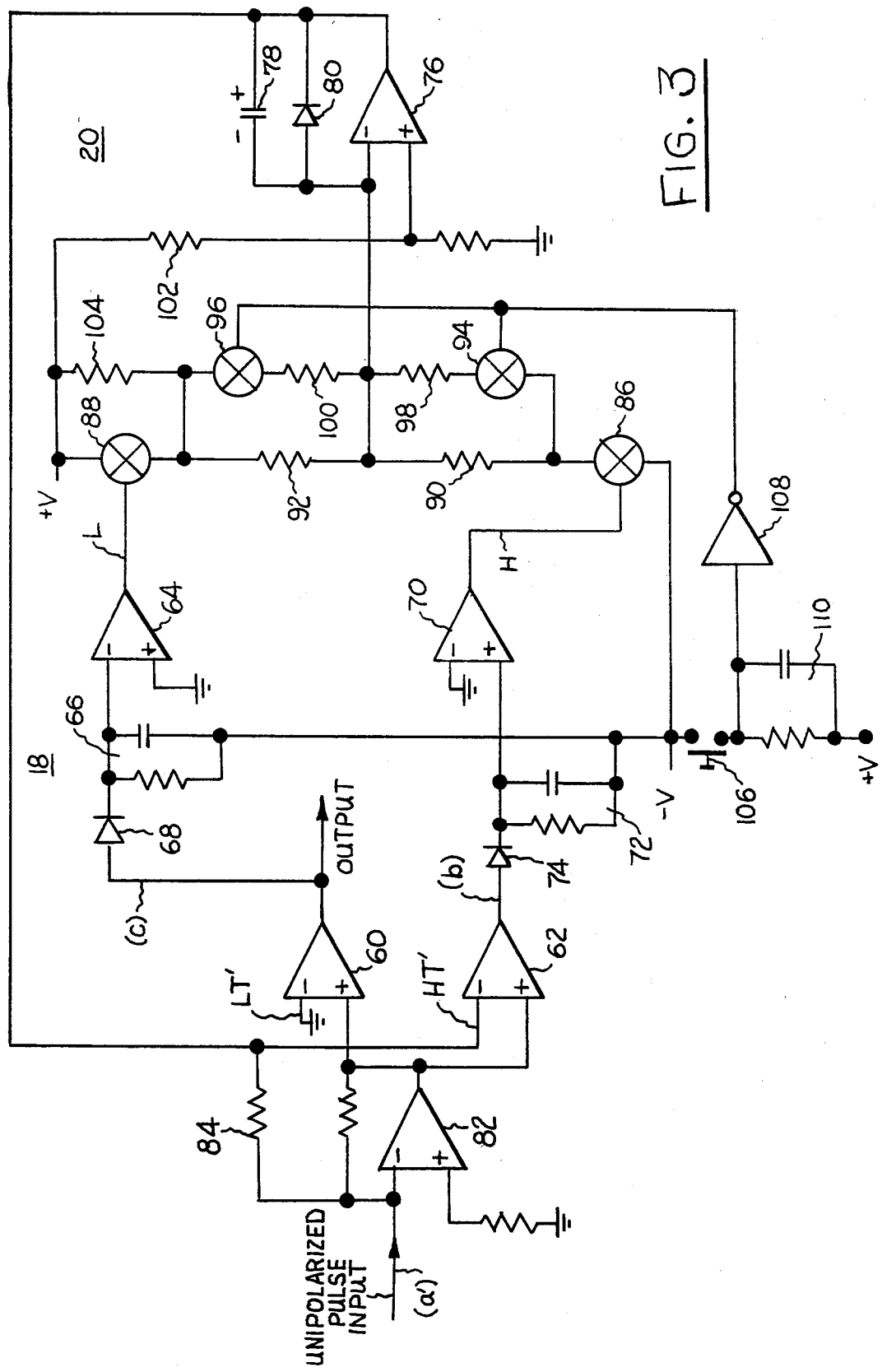
FIG. 3 is a schematic diagram illustrating the amplitude responsive pulse rate detector and variable level generator circuits in accordance with another embodiment of the invention.

Referring to FIG. 1, there is shown an input amplifier 10, which is connected to the sensors which develop the signals to be detected. These may be the electrodes which may be placed on a patient to derive ECG signals. The amplifier 10 may be a multistage amplifier having a balanced input stage for common mode rejection which is translated to a single ended output and AC coupled to an output amplifier stage. The total gain of the input amplifier 10 may, for example be 1000.

A band pass filter 12 is connected to the output of the input amplifier 10. In the case where the signals are ECG signals and the R wave components thereof are to be detected, the filter 12 may suitably be an active filter having a pass band from approximately 2 Hz to 10 Hz. Both low frequency noise (primarily base line instability) and very high frequency noise (for example, power line noise) are removed by the filter 12. It may be desirable, although it is not essential, to reject muscle noise which may be within the band pass of the filter. In such event a nonlinear active filter may be used ahead of the band pass filter 12. The band pass filter 12 also reduces motion artifacts and suppresses T waves as well as removing or screening out frequency components above the ECG frequency range.

In order that the apparatus will be insensitive to the polarity of the R waves in the ECG signal, it is desirable that all the R waves be of like polarity. A unipolarizing circuit 14 which provide output pulses corresponding to the absolute magnitude of the input pulses (provides output pulses of like polarity), may be used. This circuit may have two channels, namely a direct channel and an inverting channel with rectification and twice the gain in the direct channel, such that when the inverting and direct channel are summed, the output pulses are of the same polarity and are equalized in amplitude. The like polarity pulses correspond to the R waves and any artifacts which are contained therein. The examples of such pulses extend vertically from the base line 16 in waveform (a) of FIG. 4.

These pulses are applied to an amplitude responsive pulse rate detector 18 which provides two outputs indicated at H and L depending upon whether the pulses exceed a high threshold (HT) or a low threshold (LT). These thresholds are generated in a variable level generator 20 and are fed back from the variable level generator 20 to the amplitude responsive pulse rate detector 18. The thresholds are adaptively variable, simultaneously with both the amplitude and the repetition rate of the pulses which are applied to the input of the detector 18 from the unipolarizing circuit 14. The LT level is a predetermined portion or proportion of the HT level as shown in waveform (a) of FIG. 4. The signals to be detected are R waves, and corresponding outputs are provided when the signals exceed the LT level. The output R wave signals may be taken from the pulse rate detector 18 and applied to pulse rate counting circuits, alarm circuits or display circuits for developing informative displays, for example histograms of the R wave rate.

The amplitude responsive pulse rate detector 18 may be implemented by comparator circuits 22 and 24, to one input of which the unipolarized pulses are applied (see FIG. 2). A voltage divider 26 applies a certain fixed portion of the HT level as the reference or fiduciary input to the comparator 24. The full HT level is applied to the other comparator 22. The LT level may suitably be one half of the HT level. The comparator 22 detects when the signal crosses the high threshold (HT) reference level, while increasing in amplitude. With the exemplary pulses shown in waveform (a) of FIG. 4, the output pulses obtained for the comparator 22 are shown in waveform (b).

The comparator 22 detects when the signal exceeds the low threshold (LT), while increasing in amplitude. The rising edge of the output of the comparator may be used as an indication that an R wave has been detected, and to provide the output pulses which are used by rate meters, alarm circuits or other systems, for example which provide the displays from the R wave outputs. The signals detected by the comparator 24 are shown in waveform (c) of FIG. 4.

The comparator 22 triggers a timer circuit 28, which may be a retriggerable one shot which produces a pulse of duration (times out in an interval) equal or less than the nominal period of the R waves. This nominal period may be the slowest expected heart rate R to R interval. An interval of about one second may be suitable. The timer 28, thus, serves to standardize and lengthen the R wave pulse from the comparator 22. The timer has the additional advantage of providing an insensitive period so that a burst of muscle noise (one such burst being shown at 30 in FIG. 4(a) and in FIG. 4(a')) will at most effect the control voltage threshold level applied to the comparators 20 and 24, as if it were a single artifact. The output of the timer 28 is the H signal, and is shown in waveform H in FIG. 4 for the exemplary sequence of pulses shown in waveform (a).

The comparator 24 is connected to trigger another timer 32, which may also be a retriggerable one shot. This one shot 32 provides an output pulse of duration (has a time out interval) preferably greater than the nominal period of the R waves (R to R interval). This period for example may be one and a half or two times the nominal period of the slowest R wave which is anticipated. A suitable period may be two seconds. The output pulses from the timer 32 are inverted in an inverting amplifier. Waveform L shows the inverting amplifier output for the exemplary sequence of pulses illustrated in FIG. 4(a).

The variable level generator 20 is provided by an integrating circuit 36 which generates a ramp waveform. The ramp increments and increases in amplitude level when an electronic switch 38 is enabled by the H output pulses from the timer, since charging current is applied to the integrating circuit 36 from a source indicated as −V through a resistor 40 and the electronic switch 38. The output of the integrator circuit 36 is the control signal or threshold level. Inasmuch as the amplitude on this control signal increases only if the input pulses exceed the previously established peak amplitude thereof, the level established in the integrator circuit 36 is proportional to the average peak amplitude of the input pulses (the R wave components of the ECG signals). This average peak amplitude is referred to as the AVP.

Figure 4:
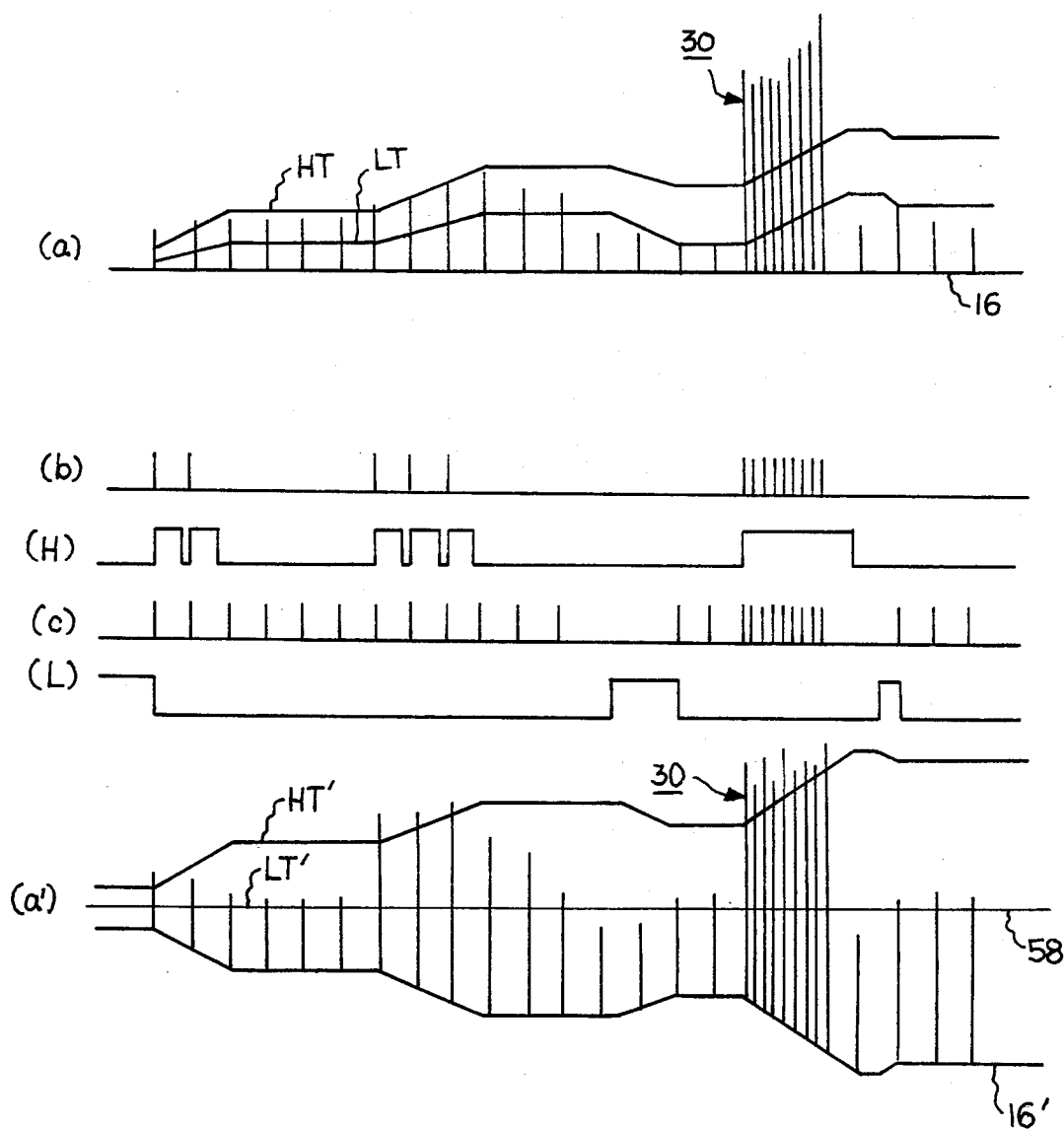
FIG. 4 is a series of waveform diagrams which illustrates the operation of the apparatus shown in FIGS. 2 and 3.

If the input pulse falls below the proportion of the AVP established by the divider 26, which is the LT or low threshold level, for longer than the time out interval of the timer 32, another electronic switch 42 closes. The integrator output voltage then decrements or ramps down towards zero volts; the input being through the resistor 44 and switch 42. Only when an input signal amplitude drops below the LT level of the comparator 24, will the timer 32 time out and the switch 42 close. This action continues until an input signal is detected or until a preset minimum threshold, which may be established by a resistor (not shown) between the input of the integrating circuit 36 and the source at +V. If an input pulse or R wave is again detected, the timer 32 will once more be triggered causing the switch 42 to open and the decrementing of the control signal to stop. Then the AVP holds steady. The waveforms (a),(b),(c), H and L shown in FIG. 4 illustrate that the control signal remains steady when the input pulses exceed the LT threshold, increments when the input pulses exceed the HT threshold, and decrements when the input pulses drop below the LT threshold. As noted above a burst of artifacts such as the muscle noise pulses 30 merely has the same effect as an input pulse which exceeds HT.

In order that the AVP is desensitized to artifacts, the time constant of the integrating circuit may be made very large. For example a capacitor of 10 microfarads capacitance may be used together with 10 megohm resistors 40 and 44. Then the apparatus is desensitized to noise and cardiac arrests will not go undetected because the AVP has adapted to fast. Such a slow rate of change may make the time that it takes to initialize the apparatus too long, as when a patient is connected up or there is a change in the positioning of the sensors or leads of the patient. In that event additional electronic switches 46 and 48 may be used which are connected to the sources of operating voltage at +V and −V by resistors 50 and 52 of much lower value than the resistors 40 and 44. These resistors 50 and 52 may suitably be one megohm in resistance value. The electronic switches 46 and 48 may be enabled and closed either manually by means of a "learn switch" 54. A timer 56, which may be a one shot, produces an output pulse during a learning period, suitably 10 seconds. During the learning period the rate of change of the control signal and the AVP is increased, by a factor of ten. This allows the apparatus to be initialized very quickly. The electronic switches 38, 42, 46 and 48 are suitably integrated circuit, analog switches.

In order to detect R waves which exceed the AVP by a different proportion than defined by the LT level, another comparator 25 may be used to provide the output pulses. This comparator may be set at a level close to AVP, for example 80% of AVP. While voltage sources are indicated as controlling the incrementing and decrementing of the control signal, other equivalent sources may be used, for example switchable current sources. Then, the output of the integrating circuit may utilize a buffer amplifier to apply the control signal to the comparator 22 and 24.

The learn period may also be automatically operated by using a circuit which produces a triggering pulse to the timer 56 on power up. The timer 56 may be eliminated, if the learn switch is held closed, manually, for the desired learning period.

FIG. 3 illustrates the amplitude responsive pulse rate detector 18 and the variable generator 20 in somewhat greater detail. In the circuit of FIG. 3, the control signal is illustrated in FIG. 4($a'$) for a sequence of input pulses similar to the pulses in the waveform of FIG. 4($a$). Consider, however, the base line 16' of the signals is depressed below reference potential 58, which is ground potential in FIG. 3. Ground potential may be used as the low threshold, LT. This is effectively "lowering of the river" instead of "raising the bridge" and may be advantageous in that the full range of complementary positive and negative voltages from conventional power supplies becomes available so as to increase the dynamic amplitude range of the system.

In FIG. 3, operational amplifiers 60 and 62 are used as the threshold detectors. An operational amplifier 64 with an RC circuit 66 and a diode 68 connected to its input provides the timer which is triggered by the positive pulses from the detector 60. A similar operational amplifier 70, but with the polarity of its inputs reversed from the operational amplifier 64, also has an RC circuit 72 and a diode 74 connected to its input to provide the other timer which is triggered by the detector 62, which is referenced to the high threshold HT'. The reversal of the polarities of the amplifiers 64 and 70 obviates the need for an inverting amplifier, as used in the FIG. 2 embodiment after the timer 32.

The integrator 36 is provided by an operational amplifier 76 having a capacitor 78 connected between its output and inverting input. A diode 80 is connected in shunt with capacitor 78 to prevent reversal of the polarity of the control voltage, which is developed across the capacitor 78. This is a ramp waveform as illustrated by the HT' and base line 16' levels shown in FIG. 4($a'$). The control voltage is applied to the peak detector 62 as the HT' threshold level. A preset portion of the control voltage is applied to the input of an inverting amplifier 82 by way of a resistor 84. Consider that the inverting amplifier 82 is connected to the direct input of the detector 60 while its inverting input is grounded to the reference potential 58 to provide the LT' reference or fiduciary level. The input to the detector 60 is effectively lowered by the preset proportion of AVP by means of the inverting amplifier 82; the preset portion being established by the resistor 84.

The variable level generator includes electronic switches 86 and 88 which are enabled by the L and H pulses. When the switch 86 is enabled, the ramp voltage at the output of the integrator amplifier 76 increases as charging current flows through the switch 86 via a charging resistor 90 to the integrating amplifier 76. Similarly during the L pulses, the switch 88 is enabled, and the amplitude of the voltage across the capacitor 78 decrements; current flowing through the switch 88 and another resistor 92. It will be seen that the voltage across the capacitor 78 is measured between the output of the amplifier 76 and ground.

The learning cycle utilizes two other electronic switches 94 and 96 and resistors 98 and 100 of lower resistance values than the resistors 90 and 92, as explained above in connection with FIG. 2. The minimum control signal level is established by voltage divider 102 which is connected between the source at +V and ground. The junction of the resistors in the divider 102 is connected to the direct input of the integrator amplifier 76. A resistor 104 is connected to the inverting input of the integrator amplifier 76 via the resistor 92. The purpose of the resistor 104 is to provide a slow negative ramp when the switch 88 is open, so that AVP drifts toward peak value after decrementing.

The learning cycle of the apparatus is initiated by a learn switch 106 which triggers a one shot provided by an inverting operational amplifier 108 having a RC time constant circuit 110, which establishes the time out period, in the input thereof.

It will be seen that the AVP developed across the capacitor 78 of the integrating amplifier 76 controls the threshold levels HT' and LT'. When the peak value of the input signals exceeds HT', the ramp voltage across the capacitor 76 increments. The ramp voltage decrements when the input pulses do not exceed LT'. Otherwise the ramp voltage stays constant; thus providing the AVP level and the preset proportion thereof (LT'). The time constants of charging and discharging of the capacitor 78 as well as the time out period of the timers provided in part by the amplifiers 64 and 70 desensitize the apparatus for artifacts and prevent erroneous outputs during cardiac arrests.

From the foregoing description it will be apparent that it has been provided apparatus which is generally suitable for the recognition of repetitive waveforms which may be subject to noise, and particularly the waveforms which have low duty cycle, such that the development of meaningful gain control or threshold levels is difficult. The apparatus is paticularly adapted for the detection of physiologic signals, such as the R waves of ECG signals. It will be appreciated that the apparatus may be used to detect other waveforms, for example such as may be provided by respiration sensors. Other variations and modifications in the herein described apparatus and other applications therefor will, undoubtedly, suggest themselves to those skilled in the art. Accordingly, the foregoing description should be taken as illustrative and not in a limiting sense.

I claim:

1. Apparatus for detecting repetitive signals subject to amplitude variations which comprises means for detecting said signals when they exceed a threshold level, means for adaptively controlling said threshold level simultaneously in accordance with the repetition rate and amplitude of said signals, said controlling means including means for generating a control signal for setting said threshold level which is a predetermined proportion of the average value of the peak amplitude (AVP) of said signals, said controlling means includes first means responsive to the repetition rate of those of said signals having peak amplitudes which exceed said AVP of said signals for increasing said threshold level, and second means responsive to the repetition rate of those of said signals having amplitudes which do not exceed said predetermined proportion of said AVP of said signals for decreasing said threshold level.

2. The apparatus according to claim 1 wherein said means for generating said control signal includes an integrator for generating a ramp waveform as said control signal, which ramp waveform changes in amplitude at a rate slow with respect to the changes in amplitude of said repetitive signals.

3. The apparatus according to claim 2 wherein means are included in said integrator for maintaining said ramp waveform generated therein at a minimum level.

4. The apparatus according to claim 2 wherein said first means comprises a first threshold detector, a first retriggerable timer, means for applying said control signal from said integrator to set said threshold level at said AVP of said signals, said signals being applied to said first threshold detector, said first threshold detector being connected in triggering relationship with said first timer to trigger said first timer each time said signals have a peak amplitude which exceeds said AVP of said signals to produce first output pulses from said first timer, said second means comprising a second threshold detector to which said signals are also applied, means for applying said control signal to said second threshold detector to set the threshold level thereof, at said predetermined portion of said AVP of said signals, a second timer connected in triggering relationship with said second threshold detector to trigger said second timer each time said signals have a peak amplitude which exceeds said predetermined portion of said AVP of said signals to produce second output pulses, and said generating means including means operated by said first output pulses for incrementing said ramp waveform, and means responsive to said second output pulses for decrementing said ramp waveform.

5. The apparatus according to claim 4 wherein said incrementing and decrementing means includes means for changing selectively the rate at which said ramp waveform is incremented and decremented for rapidly initializing said apparatus.

6. The apparatus according to claim 4 wherein said first and second threshold detectors are first and second comparators, respectively, said first and second comparators each having two inputs, one for a reference level and the other for a variable level, and amplitude divider means for applying said AVP as said control voltage to said reference input of said first comparator and said predetermined proportion of said AVP to said reference input of said second comparator, said signals being applied to said variable level inputs of said first and second comparators.

7. The apparatus according to claim 4 wherein said first and second threshold detectors are first and second comparators, each having an input for a variable level and an imput for a reference level, an inverting amplifier for applying said signals to the variable level inputs of said first and second comparators, means for summing said predetermined portion of said AVP with said signals in said inverting amplifier, said AVP of said signals from said integrator being applied to said reference input of said first comparator, and said reference input of said second comparator being connected to a point of reference potential.

8. The apparatus according to claim 4 wherein said signals have a nominal period, said first timer of being a first retriggerable one shot for providing a pulse when triggered equal or less than the nominal period of said signals, and said second timer being a second retriggerable one shot providing a pulse when triggered having a duration equal or greater than the nominal period of said signals.

9. The apparatus according to claim 8 wherein the duration of said pulses provided by said first one shot is less than said nominal period by a fraction of said normimal period approximately $\frac{1}{2}$ of said nominal period or less, and the duration of said pulses provided by said second one shot is greater than said nominal period by $1\frac{1}{2}$ to 2 times said nominal period.

10. The apparatus according to claim 1 wherein said signals are physiological signals and further comprising means for filtering said signals, means for converting said signals into signals of like polarity, and means for applying said signals of like polarity to said threshold detecting means.

11. The apparatus according to claim 1 wherein said physiological signals are pulsatile signals, such as EOG signals, and said filtering means is operative to band pass filter said signals so as to pass the R wave components thereof.

12. Apparatus for detecting repetitive pulsatile components of physiological signals, such as the R waves of ECG signals which comprises, first and second threshold detectors each having a signal and a reference level input and an output, first and second triggerable pulse generators each for generating pulse of preset duration at the output thereof when triggered at the input thereof in response to the output of said first and second threshold detectors, respectively, an integrator having a capacitor, means including first and second switches for respectively incrementing and decrementing the voltage to which said capacitor is charged, said first triggerable pulse generator output being connected to said first switch and said second triggerable pulse generator output being connected to said second switch, said integrator being connected to the reference inputs of said threshold detectors for applying relatively greater and smaller portions of said voltage to said reference inputs of said first and second threshold detectors, respectively, the output of said second threshold detector representing the occurrence of said physiological signals.

13. The apparatus according to claim 12 wherein the period of the output pulses from said first pulse generator is equal or less than the nominal period of said physiological signals, and the period of the output pulses from said second pulse generator is equal or greater than the nominal period of said physiological signals.

14. The apparatus according to claim 11 wherein said incrementing means includes means operated by third and fourth switches for increasing the rate at which said voltage is incremented and decremented, respectively, and means for selectively operating said switches to initialize said apparatus.

15. The apparatus according to claim 12 wherein said first and second threshold detectors are first and second comparator circuits.

16. The apparatus according to claim 15 further comprising a voltage divider for applying said greater and smaller portions of said voltage to the reference inputs of said first and second comparator circuits, respectively.

17. The apparatus according to claim 15 further comprising an inverting amplifier for applying said signal to the signal inputs of said first and second comparators, a summing circuit at the input of said inverting amplifier to which a predetermined proportion of said voltage is applied, the reference input of said first comparator being connected to said integrator for application of said voltage thereto, and the reference input of said second comparator being connected to a point of reference potential, such as ground.

18. The apparatus according to claim 12 further comprising means for filtering and unipolarizing said pulsatile signals before application thereof to said threshold detectors.

19. The apparatus according to claim 12 further comprising a third threshold detector having signal and reference inputs to which said signals and a predetermined portion of said capacitor voltage are respectively applied, the output of said third threshold detector representing the occurrence of said physiological signals.

* * * * *